United States Patent
Sakai et al.

(10) Patent No.: US 10,629,587 B2
(45) Date of Patent: Apr. 21, 2020

(54) PROTECTION CIRCUIT AND PROTECTION CIRCUIT SYSTEM

(71) Applicant: Mitsubishi Electric Corporation, Tokyo (JP)

(72) Inventors: Shinji Sakai, Tokyo (JP); Hisashi Oda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 260 days.

(21) Appl. No.: 15/546,539

(22) PCT Filed: Apr. 30, 2015

(86) PCT No.: PCT/JP2015/062921
§ 371 (c)(1),
(2) Date: Jul. 26, 2017

(87) PCT Pub. No.: WO2016/174756
PCT Pub. Date: Nov. 3, 2016

(65) Prior Publication Data
US 2018/0026030 A1    Jan. 25, 2018

(51) Int. Cl.
*H01L 27/02* (2006.01)
*H03K 17/082* (2006.01)
(Continued)

(52) U.S. Cl.
CPC ...... *H01L 27/0285* (2013.01); *H01L 27/0259* (2013.01); *H01L 27/0266* (2013.01);
(Continued)

(58) Field of Classification Search
USPC .................................. 361/86–87, 93.7–93.9
See application file for complete search history.

(56) References Cited

U.S. PATENT DOCUMENTS 9,007,736 B2    4/2015   Uota et al.
9,041,456 B2    5/2015   Hasegawa et al.
(Continued)

FOREIGN PATENT DOCUMENTS

JP    H09-121553 A    5/1997
JP    2010-206699 A   9/2010
(Continued)

OTHER PUBLICATIONS

International Search Report issued in PCT/JP2015/062921; dated Jun. 2, 2015.

*Primary Examiner* — Danny Nguyen
(74) *Attorney, Agent, or Firm* — Studebaker & Brackett PC

(57) ABSTRACT

The present technique relates to a protection circuit for a MOSFET and a protection circuit system including the protection circuit all of which can reduce losses in the main current and increase in the manufacturing costs for ensuring a sense area. The protection circuit includes: a first MOSFET for power through which a main current flows; an IGBT which is connected in parallel to the first MOSFET and through which a current diverted from the main current flows; a sense resistor connected in series with the IGBT; and a first control circuit that controls a gate voltage of the first MOSFET based on a value of a voltage to be applied to the sense resistor, wherein a ratio of the diverted current flowing through the IGBT to the main current flowing through the first MOSFET in current value ranges from 0.018% to 0.022%.

9 Claims, 6 Drawing Sheets

(51) Int. Cl.
*H01L 29/16* (2006.01)
*H02H 9/02* (2006.01)

(52) U.S. Cl.
CPC ...... *H01L 27/0288* (2013.01); *H01L 29/1608* (2013.01); *H02H 9/025* (2013.01); *H03K 17/0822* (2013.01); *H03K 2217/0063* (2013.01); *H03K 2217/0072* (2013.01)

(56) References Cited

U.S. PATENT DOCUMENTS

| | | | |
|---|---|---|---|
| 9,720,029 B2 * | 8/2017 | Sekigawa | G01R 19/0092 |
| 10,110,219 B2 * | 10/2018 | Kakimoto | H02M 1/08 |
| 2013/0120030 A1 | 5/2013 | Kora | |
| 2013/0155745 A1 * | 6/2013 | Tanaka | H02M 7/003 363/131 |
| 2015/0002975 A1 * | 1/2015 | Rozman | H02H 9/047 361/111 |
| 2015/0034952 A1 * | 2/2015 | Yataka | G01R 31/2608 257/48 |
| 2015/0346245 A1 * | 12/2015 | Kiep | H02M 1/08 323/271 |

FOREIGN PATENT DOCUMENTS

| | | |
|---|---|---|
| JP | 2010-263032 A | 11/2010 |
| JP | 2012-186899 A | 9/2012 |
| JP | 2013-106464 A | 5/2013 |
| JP | 2014-130909 A | 7/2014 |
| WO | 2014/136252 A1 | 9/2014 |

\* cited by examiner

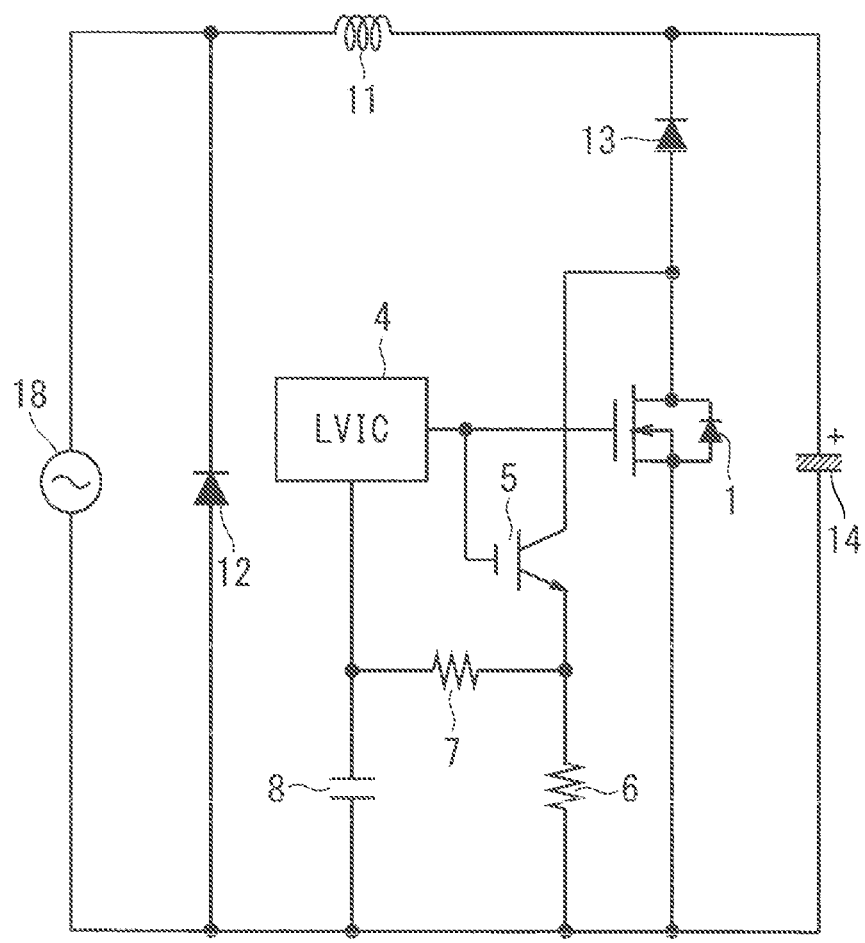
F I G. 8

PROTECTION CIRCUIT AND PROTECTION CIRCUIT SYSTEM

TECHNICAL FIELD

The present technique relates to a protection circuit for a power MOSFET and to a protection circuit system including the protection circuit.

BACKGROUND ART

Conventional power modules generally incorporate an overcurrent protecting function mainly using a shunt resistor method or a sensing method.

Furthermore, recent years have seen use of high-voltage power metal-oxide-semiconductor field-effect transistors (MOSFETs) for reducing steady loss and attempts to reduce the loss in a low-current operation (for example, see Patent Document 1).

PRIOR-ART DOCUMENTS

Patent Documents

Patent Document 1: Japanese Patent Application Laid-Open No. 2012-186899

SUMMARY

Problems to be Solved by the Invention

The MOSFETs are lower in conducting capability at a high current density than insulated gate bipolar transistors or IGBTs. Thus, the transconductance ($g_m$) of the MOSFETs decreases. Accordingly, when the shunt resistor method is used to protect an overcurrent, rise in gate voltage caused by a shunt resistor increases an ON voltage and reduces a saturation current.

Furthermore, since a resistor is inserted in a main current path in the shunt resistor method, the power loss is relatively larger. Furthermore, with aim of increasing a resistance of the resistor to be inserted, there has been a problem with requirement of using resistors whose outer dimensions are relatively larger such as cement resistors.

When the sensing method is used to protect an overcurrent for the MOSFETs, the surge resistance needs to be ensured because the saturation current of the MOSFETs is lower than that of the IGBTs. Thus, a relatively larger area in an effective region of a power MOSFET needs to be allocated as a sense region. Accordingly, it has been difficult to reduce the manufacturing costs and miniaturize the modules. Particularly, when expensive substrate materials such as SiC MOSFET are used, increase in the chip area may significantly increase the manufacturing costs.

Furthermore, when the size of the sense resistor itself is increased, the sense resistor is more susceptible to noise in the sense current. Thus, there have been problems with upsizing of a filter for removing the noise and with increase in frequency of sensing an overcurrent.

The present technique has been conceived to solve the problems, and relates to a protection circuit for a MOSFET and a protection circuit system including the protection circuit all of which can reduce losses in the main current and increase in the manufacturing costs for ensuring the sense area.

Means to Solve the Problems

A protection circuit according to an aspect of the present technique includes: a first MOSFET for power through which a main current flows; an IGBT which is connected in parallel to the first MOSFET and through which a current diverted from the main current flows; a sense resistor connected in series with the IGBT; and a first control circuit that controls a gate voltage of the first MOSFET based on a value of a voltage to be applied to the sense resistor, wherein a ratio of the diverted current flowing through the IGBT to the main current flowing through the first MOSFET in current value ranges from 0.018% to 0.022%.

A protection circuit system according to an aspect of the present technique includes: a plurality of first MOSFETs for power through which a main current flows; a single first IGBT which is connected in parallel to the first MOSFETs and through which a current diverted from the main current flows; a first sense resistor connected in series with the first IGBT; a first control circuit that controls a gate voltage of each of the first MOSFETs based on a value of a voltage to be applied to the first sense resistor; second MOSFETs connected in series with the respective first MOSFETs; and a single second control circuit that controls a gate voltage of each of the second MOSFETs, wherein the first IGBT is incorporated into the second control circuit, and a ratio of the diverted current flowing through the first IGBT to the main current flowing through each of the first MOSFETs in current value ranges from 0.018% to 0.022%.

Effects of the Invention

A protection circuit according to an aspect of the present technique includes: a first MOSFET for power through which a main current flows; an IGBT which is connected in parallel to the first MOSFET and through which a current diverted from the main current flows; a sense resistor connected in series with the IGBT; and a first control circuit that controls a gate voltage of the first MOSFET based on a value of a voltage to be applied to the sense resistor, wherein a ratio of the diverted current flowing through the IGBT to the main current flowing through the first MOSFET in current value ranges from 0.018% to 0.022%.

In such a structure, an IGBT is used as a sense element. Since the saturation current of the IGBT is higher than that of a MOSFET, a sense area required in an effective region of the MOSFET to ensure the surge resistance can be smaller than that when the MOSFET is used as a sense element. Accordingly, it is possible to reduce the manufacturing costs. Furthermore, it is possible to miniaturize the protection circuit.

Furthermore, setting a ratio of the diverted current flowing through the IGBT to the main current flowing through the MOSFET in current value from 0.018% to 0.022% can suppress the losses in the main current.

A protection circuit system according to an aspect of the present technique includes: a plurality of first MOSFETs for power through which a main current flows; a single first IGBT which is connected in parallel to the first MOSFETs and through which a current diverted from the main current flows; a first sense resistor connected in series with the first IGBT; a first control circuit that controls a gate voltage of each of the first MOSFETs based on a value of a voltage to be applied to the first sense resistor; second MOSFETs connected in series with the respective first MOSFETs; and a single second control circuit that controls a gate voltage of each of the second MOSFETs, wherein the first IGBT is incorporated into the second control circuit, and a ratio of the diverted current flowing through the first IGBT to the main current flowing through each of the first MOSFETs in current value ranges from 0.018% to 0.022%.

With such a structure, the number of parts can be reduced by sharing use of the IGBT for controlling a total three-phase current.

The objects, features, aspects and advantages of the present technique will become more apparent from the following detailed description and the accompanying drawings.

BRIEF DESCRIPTION OF DRAWINGS

FIG. 8 schematically exemplifies a structure of a protection circuit according to an embodiment.

DESCRIPTION OF EMBODIMENTS

Figure 1:
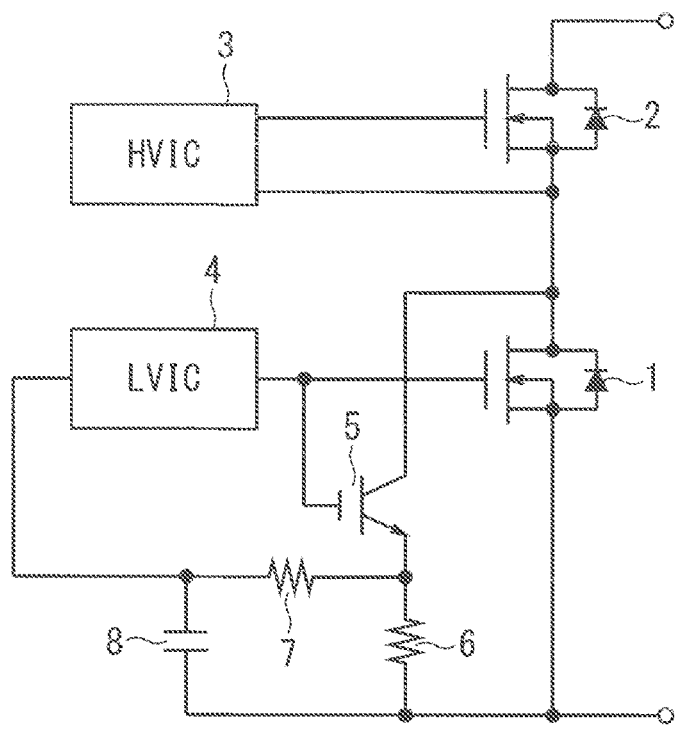
FIG. 1 schematically exemplifies a structure of a protection circuit according to an embodiment.

Embodiments will be described with reference to the attached drawings. Since the drawings are schematically illustrated, the mutual relationships in size and position between images in the different drawings are not necessarily accurate but may be changed when needed. In the following description, the same reference numerals will be assigned to the same constituent elements, where their names and functions are the same. Thus, the detailed description thereof may be omitted.

Embodiment 1

[Structure]

A protection circuit according to Embodiment 1 will be hereinafter described.

FIG. 1 schematically exemplifies a structure of the protection circuit according to Embodiment 1. As illustrated in FIG. 1, the circuit includes a MOSFET 1 for power, a MOSFET 2, a high voltage integrated circuit or HVIC 3, a low voltage integrated circuit or LVIC 4, a Si IGBT 5, a resistor 6 that is a resistor for sensing an overcurrent, a resistor 7, and a capacitor 8. The resistor 6 has a resistance of, for example, approximately several ohms. The resistor 7 and the capacitor 8 form a filter for removing noise in a sense current. The MOSFETs herein are assumed to mainly contain Si.

The drain terminal of the MOSFET 2 is connected to the high voltage side. The gate terminal of the MOSFET 2 is connected to the high voltage integrated circuit 3. The source terminal of the MOSFET 2 is connected to the drain terminal of the MOSFET 1. Furthermore, a signal line that connects the source terminal of the MOSFET 2 to the drain terminal of the MOSFET 1 branches off, and is connected to each of the collector terminal of the Si IGBT 5 and the high voltage integrated circuit 3.

The gate terminal of the MOSFET 1 is connected to the low voltage integrated circuit 4. Furthermore, a signal line that connects the gate terminal of the MOSFET 1 to the low voltage integrated circuit 4 branches off, and is connected to the gate terminal of the Si IGBT 5. The source terminal of the MOSFET 1 is connected to the low voltage side. Furthermore, a signal line that connects the source terminal of the MOSFET 1 to the low voltage side branches off, and is connected in parallel to the resistor 6 and the capacitor 8.

The emitter terminal of the Si IGBT 5 is connected to the resistor 6. Furthermore, a signal line that connects the emitter terminal of the Si IGBT 5 to the resistor 6 branches off, and is connected to the resistor 7.

The resistor 7 is connected to the low voltage integrated circuit 4. Furthermore, a signal line that connects the resistor 7 to the low voltage integrated circuit 4 branches off, and is connected to the capacitor 8. The low voltage integrated circuit 4 receives a protection signal from the resistor 7 side.

With such a circuit structure, the Si IGBT 5 and the resistor 6 connected in series with the Si IGBT 5 are connected in parallel to the MOSFET 1.

[Operations]

Figure 2:
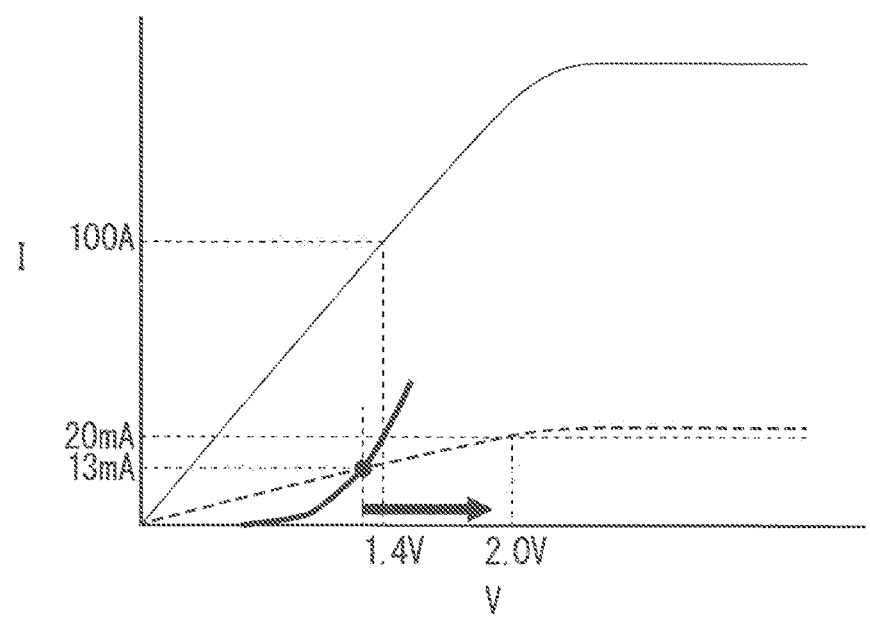
FIG. 2 exemplifies sense currents that flow through a MOSFET and an IGBT when a main current flows through the MOSFET.

Next, operations of the protection circuit according to Embodiment 1 will be described with reference to FIG. 2. FIG. 2 exemplifies a sense current that flows through a MOSFET as a sense element, and a sense current that flows through an IGBT as a sense element when a main current flows through the MOSFET. In FIG. 2, the vertical axis represents a current value "I", and the horizontal axis represents a voltage value "V". Furthermore, the main current of the MOSFET, the sense current of the MOSFET, and the sense current of the IGBT are illustrated by a thin solid line, a dotted line, and a thick solid line, respectively, in FIG. 2.

In the circuit structure of FIG. 1, both the MOSFET 1 and the Si IGBT 5 enter an ON state with application of a gate voltage at a high level according to an output signal from the low voltage integrated circuit 4. Thus, the main current flows between the drain and the source of the MOSFET 1. Furthermore, the sense current flows between the collector and the emitter of the Si IGBT 5.

When the sense current flows through the Si IGBT 5, the resistor 6 generates a voltage. Then, the low voltage integrated circuit 4 receives the generated voltage as a protection signal from the resistor 7 side.

When the protection signal received by the low voltage integrated circuit 4 is higher than or equal to a predetermined voltage value, for example, both the MOSFET 1 and the Si IGBT 5 enter an OFF state with application of a gate voltage at a low level according to an output signal from a protection circuit in the low voltage integrated circuit 4. Thus, an overcurrent is prevented from flowing through the MOSFET 1.

In the circuit structure above, an IGBT is used as the sense element. Since the saturation current of the IGBT is higher than that of the MOSFET, a sense area required in an effective region of a power MOSFET to ensure the surge resistance can be smaller than that when the MOSFET is used as a sense element. Thus, it is possible to reduce the manufacturing costs and miniaturize the modules.

With reference to FIG. 2, there is a clear difference between values of the sense currents that flow through the MOSFET and the IGBT as the sense elements. Specifically, with application of a voltage having a given magnitude or higher, for example, approximately 1.4 V, the value of the sense current flowing through the IGBT is approximately 20 mA, which is higher than that of the sense current flowing through the MOSFET. Conversely, when the value of the sense current flowing through the MOSFET is set to approximately 20 mA, approximately 2.0 V needs to be applied (see FIG. 2). In other words, in an area where the sense current is relatively higher, e.g., an area where the sense current is approximately higher than or equal to 13 mA in FIG. 2, the IGBT is higher in conducting capability than the MOSFET. Thus, when a value of a voltage caused by the sense current is measured, a resistor with a lower resistance value can be used.

In the circuit structure above, an IGBT is used as the sense element. Thus, when a value of a voltage caused by the sense current is measured, a resistor with a lower resistance value can be used. Thus, noise in the sense current can be reduced. Furthermore, upsizing of a filter for removing the noise and increase in frequency of sensing an overcurrent can be prevented.

For example, when the value of the main current flowing through the MOSFET is approximately 100 A, adjusting the value of the sense current that flows through the IGBT serving as a sense element to approximately 20 mA, that is, adjusting a current diversion ratio of the sense element to approximately 0.02%, specifically, to range approximately from 0.018% to 0.022% can sufficiently suppress the influence on the main current. Examples of the specific method for adjusting the current diversion ratio include adjusting an effective area of an emitter of an IGBT.

Furthermore, the current diversion ratio can be increased in a range where the IGBT is higher in conducting capability than the MOSFET. This is because increase in the manufacturing costs for ensuring the sense area can be reduced in such a range.

Embodiment 2

[Structure]

A protection circuit according to Embodiment 2 will be described. Hereinafter, the same reference numerals will be assigned to the same structures described in Embodiment 1, and the detailed description thereof will be omitted when needed.

Figure 3:
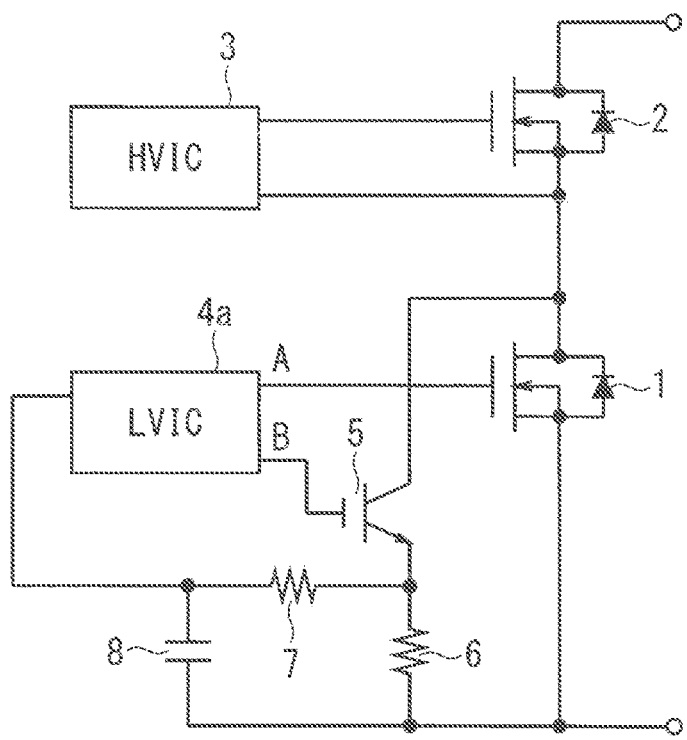
FIG. 3 schematically exemplifies a structure of a protection circuit according to an embodiment.

FIG. 3 schematically exemplifies a structure of the protection circuit according to Embodiment 2. As illustrated in FIG. 3, the circuit includes the MOSFET 1, the MOSFET 2, the high voltage integrated circuit 3, a low voltage integrated circuit 4a, the Si IGBT 5, the resistors 6 and 7, and the capacitor 8. The resistor 7 and the capacitor 8 form a filter for removing noise in a sense current.

The gate terminal of the MOSFET 1 is connected to the low voltage integrated circuit 4a. Furthermore, the gate terminal of the Si IGBT 5 is connected to the low voltage integrated circuit 4a through a path different from that through which the gate terminal of the MOSFET 1 is connected thereto. The source terminal of the MOSFET 1 is connected to the low voltage side. Furthermore, a signal line that connects the source terminal of the MOSFET 1 to the low voltage side branches off, and is connected in parallel to the resistor 6 and the capacitor 8.

The emitter terminal of the Si IGBT 5 is connected to the resistor 6. Furthermore, a signal line that connects the emitter terminal of the Si IGBT 5 to the resistor 6 branches off, and is connected to the resistor 7.

The resistor 7 is connected to the low voltage integrated circuit 4a. Furthermore, a signal line that connects the resistor 7 to the low voltage integrated circuit 4a branches off, and is connected to the capacitor 8. The low voltage integrated circuit 4a receives a protection signal from the resistor 7 side.

With such a circuit structure, the Si IGBT 5 and the resistor 6 connected in series with the Si IGBT 5 are connected in parallel to the MOSFET 1.

Furthermore, since the low voltage integrated circuit 4a is separately connected to each of the gate terminal of the MOSFET 1 and the gate terminal of the Si IGBT 5, it can apply a gate voltage separately to each of the gate terminals.

[Operations]

Figure 4:
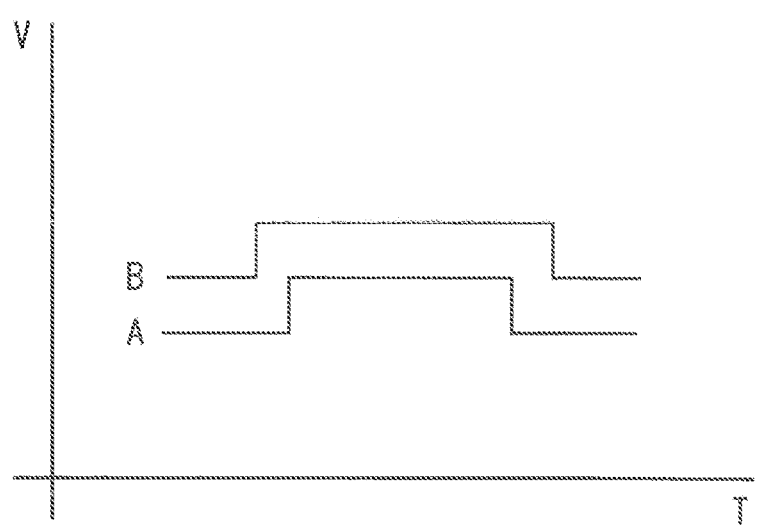
FIG. 4 exemplifies voltage sequences of a path through which the gate terminal of the MOSFET is connected to a low voltage integrated circuit and a path through which the gate terminal of a Si IGBT is connected to the low voltage integrated circuit.
Figure 5:
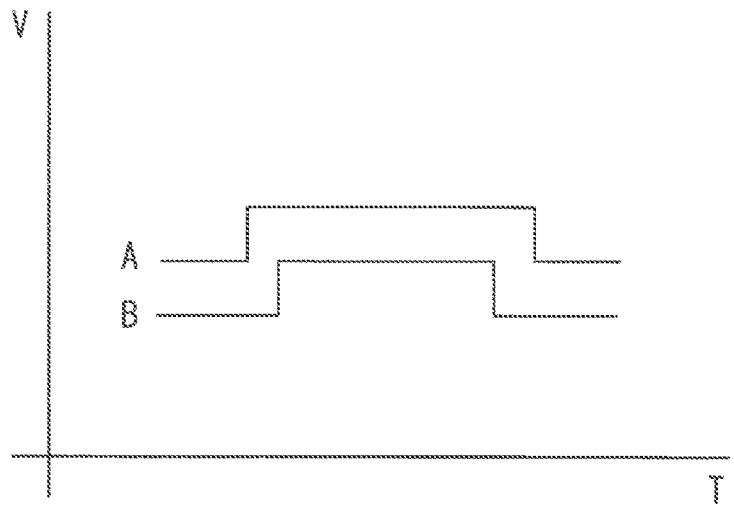
FIG. 5 exemplifies voltage sequences of the path through which the gate terminal of the MOSFET is connected to the low voltage integrated circuit and the path through which the gate terminal of the Si IGBT is connected to the low voltage integrated circuit.

Next, operations of the protection circuit according to Embodiment 2 will be described with reference to FIGS. 4 and 5. FIGS. 4 and 5 exemplify voltage sequences of a path through which the gate terminal of the MOSFET 1 is connected to the low voltage integrated circuit 4a and a path through which the gate terminal of the Si IGBT 5 is connected to the low voltage integrated circuit 4a, that is, a path A and a path B. In FIGS. 4 and 5, the vertical axis represents a voltage value "V", and the horizontal axis represents a time "T".

In a switching operation for causing the MOSFET 1 and the Si IGBT 5 to enter the ON state under the circuit structure of FIG. 3, a gate voltage is applied at a high level, first, only to the path B and then to the path A. In other words, as illustrated in FIG. 4, when a high-level gate voltage is applied only to the path B and a low-level gate voltage is applied to the path A, only the Si IGBT 5 enters the ON state. Thus, the main current flows only between the collector and the emitter of the Si IGBT 5. Since the saturation current of the IGBT is higher than that of the MOSFET, it is effective at conducting a high current. Furthermore, since no current flows between the drain and the source of the MOSFET 1, increase in ON voltage across the MOSFET 1 can be reduced.

In a switching operation for causing the MOSFET 1 and the Si IGBT 5 to enter the OFF state, applying a gate voltage at a low level, first, only to the path A and then to the path B produces the same advantages above.

Furthermore, in the switching operation for causing the MOSFET 1 and the Si IGBT 5 to enter the ON state under the circuit structure of FIG. 3, a gate voltage may be applied at a high level, first, only to the path A and then to the path B. In other words, as illustrated in FIG. 5, when a high-level gate voltage is applied only to the path A and a low-level gate voltage is applied to the path B, only the MOSFET 1 enters the ON state. Thus, the main current flows only between the drain and the source of the MOSFET 1. Thus, it is possible to reduce losses in the resistor 6 that is a resistor for sensing an overcurrent. Furthermore, since no recovery current flows through the Si IGBT 5, the erroneous interruption by the recovery current can be suppressed.

In a switching operation for causing the MOSFET 1 and the Si IGBT 5 to enter the OFF state, applying a gate voltage at a low level, first, only to the path B and then to the path A produces the same advantages above.

Embodiment 3

[Structure]

A protection circuit according to Embodiment 3 will be described. Hereinafter, the same reference numerals will be assigned to the same structures described in Embodiments 1 and 2, and the detailed description thereof will be omitted when needed.

Figure 6:
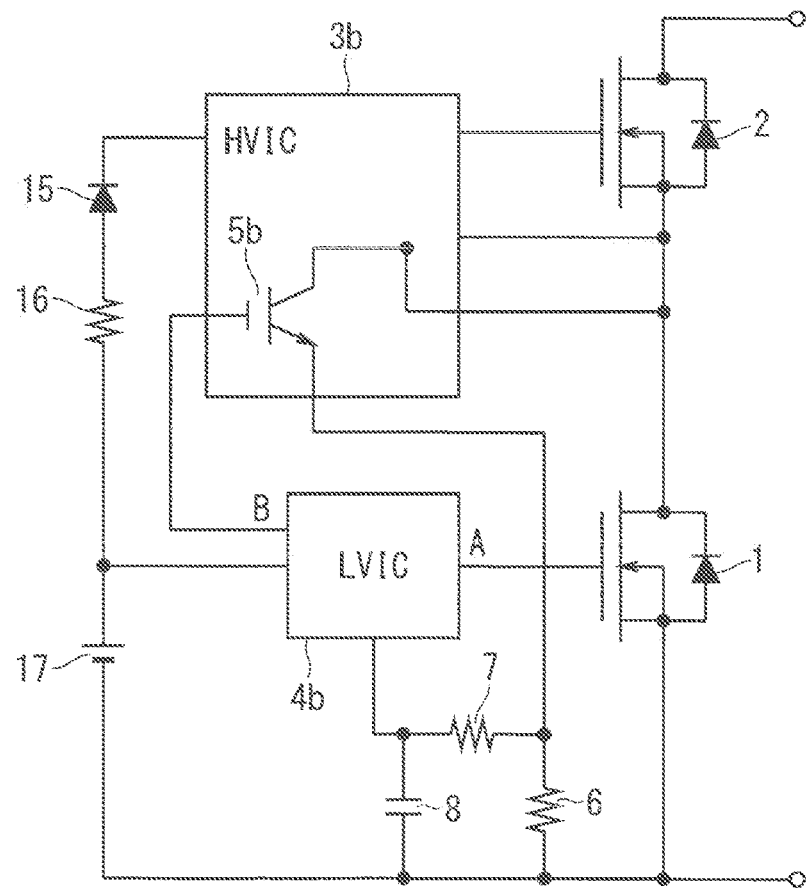
FIG. 6 schematically exemplifies a structure of a protection circuit according to an embodiment.

FIG. 6 schematically exemplifies a structure of the protection circuit according to Embodiment 3. As illustrated in FIG. 6, the circuit includes the MOSFET 1, the MOSFET 2, a high voltage integrated circuit 3b, a low voltage integrated circuit 4b, a Si IGBT 5b, the resistor 6 that is a resistor for sensing an overcurrent, the resistor 7, the capacitor 8, a diode 15, a resistor 16, and a DC power supply 17. The Si IGBT 5b is housed in the high voltage integrated circuit 3b. The resistor 6 has a resistance of, for example, approximately several ohms. Furthermore, the resistor 7 and the capacitor 8 form a filter for removing noise in a sense current.

The drain terminal of the MOSFET 2 is connected to the high voltage side. The gate terminal of the MOSFET 2 is connected to the high voltage integrated circuit 3b. The source terminal of the MOSFET 2 is connected to the drain terminal of the MOSFET 1. Furthermore, a signal line that connects the source terminal of the MOSFET 2 to the drain terminal of the MOSFET 1 branches off, and is connected to the high voltage integrated circuit 3b. Another signal line connecting the source terminal of the MOSFET 2 to the drain terminal of the MOSFET 1 that is closer to the MOSFET 1 than to the former branch point branches off, and is connected to the collector terminal of the Si IGBT 5b.

The gate terminal of the MOSFET 1 is connected to the low voltage integrated circuit 4b. The source terminal of the MOSFET 1 is connected to the low voltage side. Furthermore, a signal line that connects the source terminal of the MOSFET 1 to the low voltage side branches off, and is connected in parallel to the resistor 6, the capacitor 8, and the DC power supply 17.

The emitter terminal of the Si IGBT 5b is connected to the resistor 6. Furthermore, a signal line that connects the emitter terminal of the Si IGBT 5b to the resistor 6 branches off, and is connected to the resistor 7.

The resistor 7 is connected to the low voltage integrated circuit 4b. Furthermore, a signal line that connects the resistor 7 to the low voltage integrated circuit 4b branches off, and is connected to the capacitor 8. The low voltage integrated circuit 4b receives a protection signal from the resistor 7 side.

The DC power supply 17 is connected in series with the resistor 16 and the diode 15. The diode 15 is connected to the high voltage integrated circuit 3b. Furthermore, a signal line that connects the DC power supply 17 to the resistor 16 branches off, and is connected to the low voltage integrated circuit 4b.

With such a circuit structure, the Si IGBT 5b and the resistor 6 connected in series with the Si IGBT 5b are connected in parallel to the MOSFET 1.

Furthermore, since the low voltage integrated circuit 4b is separately connected to each of the gate terminal of the MOSFET 1 and the gate terminal of the Si IGBT 5, it can apply a gate voltage separately to each of the gate terminals.

In a switching operation for causing the MOSFET 1 and the Si IGBT 5b to enter the ON state under the circuit structure of FIG. 6, a gate voltage is applied at a high level, first, only to the path B and then to the path A. In other words, when a high-level gate voltage is applied only to the path B and a low-level gate voltage is applied to the path A, only the Si IGBT 5b enters the ON state. Thus, the main current flows only between the collector and the emitter of the Si IGBT 5b. Since the saturation current of the IGBT is higher than that of the MOSFET, it is effective at conducting a high current. Furthermore, since no current flows between the drain and the source of the MOSFET 1, increase in ON voltage across the MOSFET 1 can be reduced.

In a switching operation for causing the MOSFET 1 and the Si IGBT 5b to enter the OFF state, applying a gate voltage at a low level, first, only to the path A and then to the path B produces the same advantages above.

Furthermore, in the switching operation for causing the MOSFET 1 and the Si IGBT 5b to enter the ON state under the circuit structure of FIG. 6, a gate voltage may be applied at a high level, first, only to the path A and then to the path B. In other words, when a high-level gate voltage is applied only to the path A and a low-level gate voltage is applied to the path B, only the MOSFET 1 enters the ON state. Thus, the main current flows only between the drain and the source of the MOSFET 1. Thus, it is possible to reduce losses in the resistor 6 that is a resistor for sensing an overcurrent.

In a switching operation for causing the MOSFET 1 and the Si IGBT 5b to enter the OFF state, applying a gate voltage at a low level, first, only to the path B and then to the path A produces the same advantages above.

Since the Si IGBT 5b is housed in the high voltage integrated circuit 3b in the structure above, the sense element for sensing an overcurrent does not need to be provided separately, and the number of parts can be reduced. Thus, the manufacturing costs and the circuit scale can be reduced.

Embodiment 4

[Structure]

A protection circuit system according to Embodiment 4 will be described. Hereinafter, the same reference numerals will be assigned to the same structures described in Embodiments 1 to 3, and the detailed description thereof will be omitted when needed.

Figure 7:
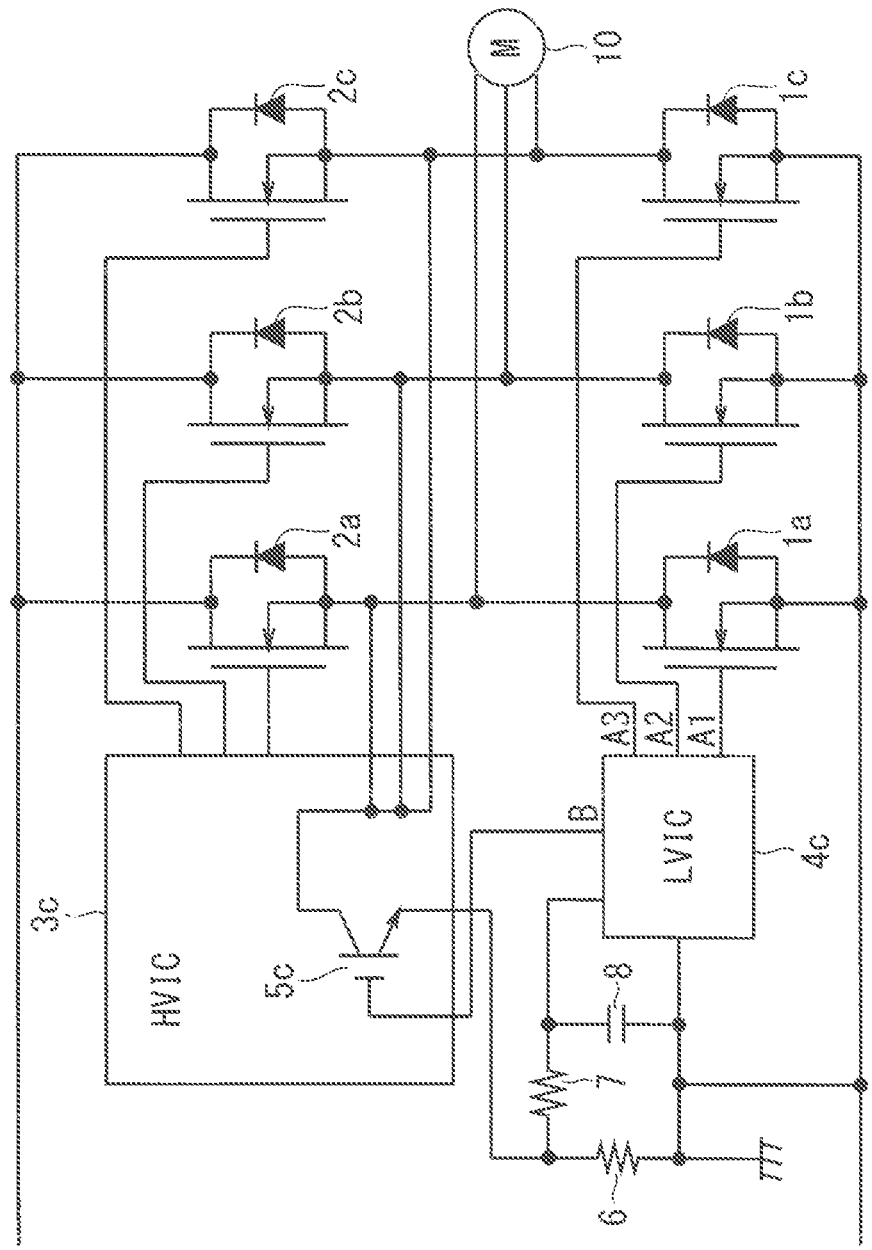
FIG. 7 schematically exemplifies a structure of a protection circuit system according to an embodiment.

FIG. 7 schematically exemplifies a structure of the protection circuit system according to Embodiment 4. As illustrated in FIG. 7, the circuit system includes MOSFETs 1a, 1b, 1c, 2a, 2b, and 2c, a high voltage integrated circuit 3c, a low voltage integrated circuit 4c, a Si IGBT 5c, the resistor 6 that is a resistor for sensing an overcurrent, the resistor 7, the capacitor 8, and a motor 10. The Si IGBT 5c is housed in the high voltage integrated circuit 3c.

The drain terminals of the MOSFETs 2a, 2b, and 2c are connected to the high voltage side. The gate terminals of the MOSFETs 2a, 2b, and 2c are connected to the high voltage integrated circuit 3c.

The source terminal of the MOSFET 2a is connected to the drain terminal of the MOSFET 1a. Furthermore, a signal line that connects the source terminal of the MOSFET 2a to the drain terminal of the MOSFET 1a branches off, and is connected to each of the collector terminal of the Si IGBT 5c and the motor 10. The source terminal of the MOSFET 1a is connected to the low voltage side. Furthermore, a signal line that connects the source terminal of the MOSFET 1a to the low voltage side branches off, and is connected in parallel to the resistor 6 and the capacitor 8.

The source terminal of the MOSFET 2b is connected to the drain terminal of the MOSFET 1b. Furthermore, a signal line that connects the source terminal of the MOSFET 2b to the drain terminal of the MOSFET 1b branches off, and is connected to each of the collector terminal of the Si IGBT 5c and the motor 10. The source terminal of the MOSFET 1b is connected to the low voltage side. Furthermore, a signal line that connects the source terminal of the MOSFET 1b to the low voltage side branches off, and is connected in parallel to the resistor 6 and the capacitor 8.

The source terminal of the MOSFET 2c is connected to the drain terminal of the MOSFET 1c. Furthermore, a signal line that connects the source terminal of the MOSFET 2c to the drain terminal of the MOSFET 1c branches off, and is connected to each of the collector terminal of the Si IGBT 5c and the motor 10. The source terminal of the MOSFET 1c is connected to the low voltage side. Furthermore, a signal line that connects the source terminal of the MOSFET 1c to the low voltage side branches off, and is connected in parallel to the resistor 6 and the capacitor 8.

The gate terminal of the MOSFET 1a is connected to the low voltage integrated circuit 4c (path A1). The gate terminal of the MOSFET 1b is connected to the low voltage integrated circuit 4c (path A2). The gate terminal of the MOSFET 1c is connected to the low voltage integrated circuit 4c (path A3).

The emitter terminal of the Si IGBT 5c is connected to the resistor 6. Furthermore, a signal line that connects the emitter terminal of the Si IGBT 5c to the resistor 6 branches off, and is connected to the resistor 7.

The resistor 7 is connected to the low voltage integrated circuit 4c. Furthermore, a signal line that connects the resistor 7 to the low voltage integrated circuit 4c branches off, and is connected to the capacitor 8. The low voltage integrated circuit 4c receives a protection signal from the resistor 7 side.

With such a circuit structure, the Si IGBT 5c and the resistor 6 connected in series with the Si IGBT 5c are connected in parallel to the MOSFETs 1a, 1b, and 1c.

Furthermore, since the low voltage integrated circuit 4c is separately connected to each of the gate terminals of the MOSFETs 1a, 1b, and 1c and of the Si IGBT 5c, it can apply a gate voltage separately to each of the gate terminals.

In a switching operation for causing the MOSFETs 1a, 1b, and 1c and the Si IGBT 5c to enter the ON state under the circuit structure of FIG. 7, a gate voltage is applied at a high level, first, only to the path B and then to the paths A1, A2, and A3. In other words, when a high-level gate voltage is applied only to the path B and a low-level gate voltage is applied to the paths A1, A2, and A3, only the Si IGBT 5c enters the ON state. Thus, the main current flows only between the collector and the emitter of the Si IGBT 5c. Since the saturation current of the IGBT is higher than that of the MOSFET, it is effective at conducting a high current. Furthermore, since no current flows between the drains and the sources of the MOSFETs 1a, 1b, and 1c, increase in ON voltage across the MOSFETs 1a, 1b, and 1c can be reduced.

In a switching operation for causing the MOSFETs 1a, 1b and 1c and the Si IGBT 5c to enter the OFF state, applying a gate voltage at a low level, first, only to the paths A1, A2, and A3 and then to the path B produces the same advantages above.

In a switching operation for causing the MOSFETs 1a, 1b, and 1c and the Si IGBT 5c to enter the ON state under the circuit structure of FIG. 7, a gate voltage may be applied at a high level, first, only to the paths A1, A2, and A3 and then to the path B. In other words, when a high-level gate voltage is applied only to the paths A1 to A3 and a low-level gate voltage is applied to the path B, only the MOSFETs 1a, 1b, and 1c enter the ON state. Thus, the main current flows only between the drains and the sources of the MOSFETs 1a, 1b, and 1c. Accordingly, it is possible to reduce losses in the resistor 6 that is a resistor for sensing an overcurrent.

In a switching operation for causing the MOSFETs 1a, 1b, and 1c and the Si IGBT 5c to enter the OFF state, applying a gate voltage at a low level, first, only to the path B and then to the paths A1, A2, and A3 produces the same advantages above.

Since the Si IGBT 5c is housed in the high voltage integrated circuit 3c in the structure above, the sense element for sensing an overcurrent does not need to be provided separately, and the number of parts can be reduced. Thus, the manufacturing costs and the circuit scale can be reduced.

Furthermore, the number of parts can be reduced by sharing use of the Si IGBT 5c for controlling the total three-phase current.

For example, when the value of the main current flowing through the MOSFET is approximately 100 A, adjusting the value of the sense current that flows through the IGBT serving as a sense element to approximately 20 mA, i.e., adjusting a current diversion ratio of the sense element to approximately 0.02%, specifically, to range approximately from 0.018% to 0.022% can sufficiently suppress the influence on the main current. Examples of the specific method for adjusting the current diversion ratio include adjusting an effective area of an emitter of an IGBT.

Furthermore, the current diversion ratio can be increased in a range where the IGBT is higher in conducting capability than the MOSFET. This is because increase in the manufacturing costs for ensuring the sense area can be reduced in such a range.

Embodiment 5

[Structure]

A protection circuit according to Embodiment 5 will be described. Hereinafter, the same reference numerals will be assigned to the same structures described in Embodiments 1 to 4, and the detailed description thereof will be omitted when needed.

FIG. 8 schematically exemplifies a structure of the protection circuit according to Embodiment 5. As illustrated in FIG. 8, the circuit includes the MOSFET 1, the low voltage integrated circuit 4, the Si IGBT 5, the resistor 6 that is a resistor for sensing an overcurrent, the resistor 7, the capacitor 8, a coil 11, diodes 12 and 13, an electrolytic capacitor 14, and an AC power supply 18. The resistor 7 and the capacitor 8 form a filter for removing noise in a sense current.

The drain terminal of the MOSFET 1 is connected to the diode 13. Furthermore, a signal line that connects the drain terminal of the MOSFET 1 to the diode 13 branches off, and is connected to the collector terminal of the Si IGBT 5.

The gate terminal of the MOSFET 1 is connected to the low voltage integrated circuit 4. Furthermore, a signal line that connects the gate terminal of the MOSFET 1 to the low voltage integrated circuit 4 branches off, and is connected to the gate terminal of the Si IGBT 5. The source terminal of the MOSFET 1 is connected to the resistor 6 and the capacitor 8.

The emitter terminal of the Si IGBT 5 is connected to the resistor 6. Furthermore, a signal line that connects the emitter terminal of the Si IGBT 5 to the resistor 6 branches off, and is connected to the resistor 7.

The resistor 7 is connected to the low voltage integrated circuit 4. Furthermore, a signal line that connects the resistor 7 to the low voltage integrated circuit 4 branches off, and is connected to the capacitor 8. The low voltage integrated circuit 4 receives a protection signal from the resistor 7 side.

With such a circuit structure, the Si IGBT 5 and the resistor 6 connected in series with the Si IGBT 5 are connected in parallel to the MOSFET 1. Furthermore, the MOSFET 1 and the diode 13 are connected in parallel to the diode 12. Furthermore, the MOSFET 1 and the diode 13 are connected in parallel to the electrolytic capacitor 14. Furthermore, the diode 12 is connected in parallel to the AC power supply 18. Furthermore, the coil 11 is disposed in a signal line that connects the diode 13 to the diode 12.

Furthermore, an IGBT is used as the sense element in the circuit structure above. Since the saturation current of the IGBT is higher than that of the MOSFET, a sense area required in an effective region of a power MOSFET to ensure the surge resistance can be smaller than that when the MOSFET is used as a sense element. Thus, it is possible to reduce the manufacturing costs and miniaturize the modules.

Furthermore, the structure above can reduce particularly the turn off power losses in applications requiring, as seen in a booster circuit, a high-frequency operation, that is, a high-speed switching operation. Thus, the losses of the overall system can be reduced.

Embodiment 6

[Structure]

A protection circuit system according to Embodiment 6 will be described. Hereinafter, the same reference numerals will be assigned to the same structures described in Embodiments 1 to 5, and the detailed description thereof will be omitted when needed.

Figure 9:
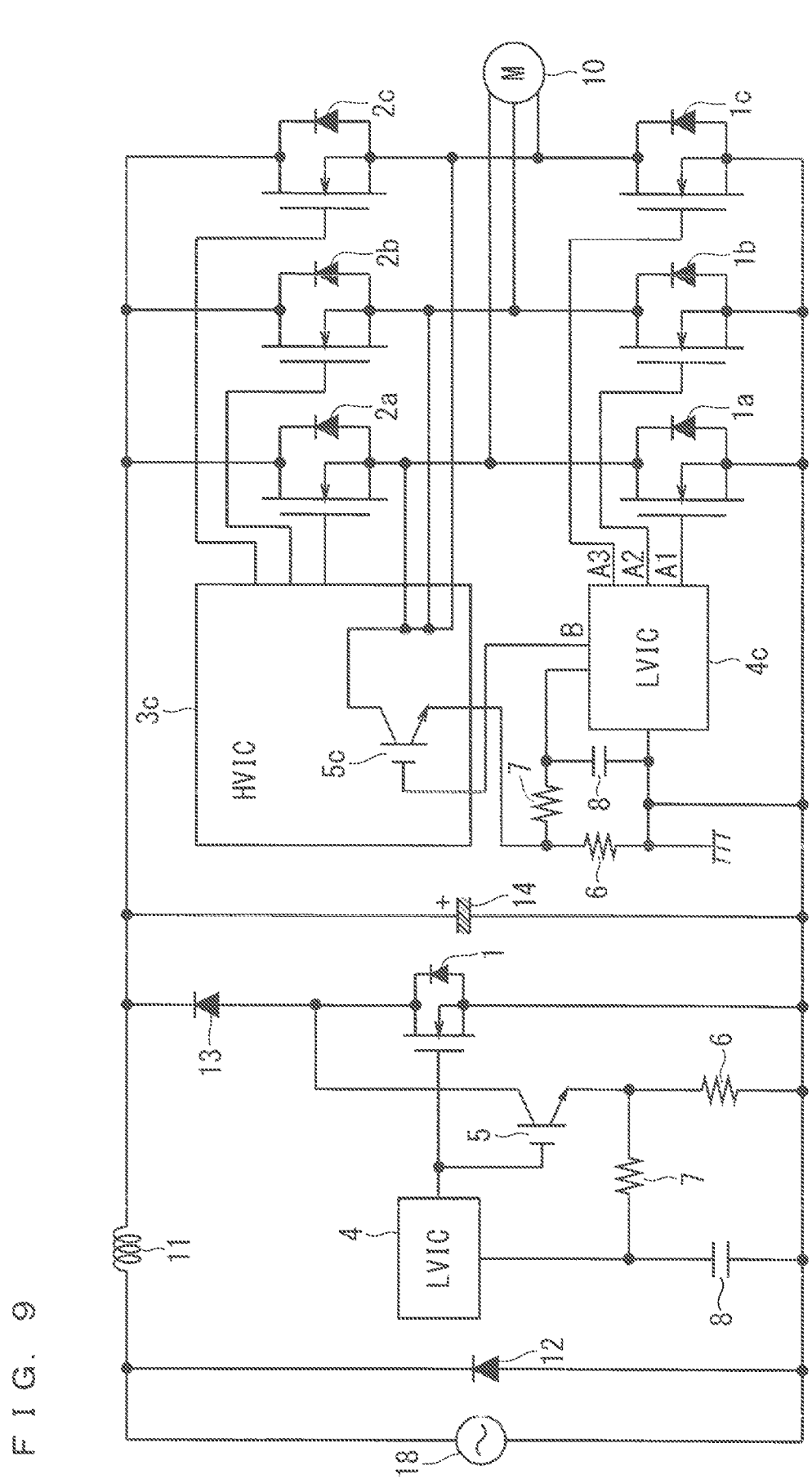
FIG. 9 schematically exemplifies a structure of a protection circuit system according to an embodiment.

FIG. 9 schematically exemplifies a structure of the protection circuit system according to Embodiment 6. The circuit structure illustrated in FIG. 9 is obtained by combining the circuit structures according to Embodiments 4 and 5. As illustrated in FIG. 9, the circuit to the left includes the MOSFET 1, the low voltage integrated circuit 4, the Si IGBT 5, the resistor 6, the resistor 7, the capacitor 8, the coil 11, the diodes 12 and 13, the electrolytic capacitor 14, and the DC power supply 18. Furthermore, the circuit to the right includes the MOSFETs 1a, 1b, 1c, 2a, 2b, and 2c, the high voltage integrated circuit 3c, the low voltage integrated circuit 4c, the Si IGBT 5c, the resistor 6, the resistor 7, the capacitor 8, and the motor 10. The Si IGBT 5c is housed in the high voltage integrated circuit 3c.

With such a circuit structure, the Si IGBT 5 and the resistor 6 connected in series with the Si IGBT 5 are connected in parallel to the MOSFET 1. Furthermore, the MOSFET 1 and the diode 13 are connected in parallel to the diode 12. Furthermore, the MOSFET 1 and the diode 13 are connected in parallel to the electrolytic capacitor 14. Furthermore, the diode 12 is connected in parallel to the AC power supply 18. Furthermore, the coil 11 is disposed in the signal line that connects the diode 13 to the diode 12.

In the circuit structure above, an IGBT is used as the sense element. Since the saturation current of the IGBT is higher than that of the MOSFET, a sense area required in an effective region of a power MOSFET to ensure the surge resistance can be smaller than that when the MOSFET is used as a sense element. Thus, it is possible to reduce the manufacturing costs and miniaturize the modules.

With the structure above, the number of parts can be reduced by sharing use of the Si IGBT 5c for controlling the total three-phase current. Particularly, the turn off power losses can be reduced in applications requiring, as seen in a booster circuit, a high-frequency operation, that is, a high-speed switching operation. Thus, the losses of the overall system can be reduced. Furthermore, the circuit scale can be reduced, and radiating fins, etc. can be downsized.

For example, when the value of the main current flowing through the MOSFET is approximately 100 A, adjusting the value of the sense current that flows through the IGBT serving as a sense element to approximately 20 mA, i.e., adjusting a current diversion ratio of the sense element to approximately 0.02%, specifically, to range approximately from 0.018% to 0.022% can sufficiently suppress the influence on the main current. Examples of the specific method for adjusting the current diversion ratio include adjusting an effective area of an emitter of an IGBT.

Furthermore, the current diversion ratio can be increased in a range where the IGBT is higher in conducting capability than the MOSFET. This is because increase in the manufacturing costs for ensuring the sense area can be reduced in such a range.

Advantages

Hereinafter, the advantages according to Embodiments above will be exemplified.

According to Embodiments above, the protection circuit includes the MOSFET 1 as a first MOSFET for power, the Si IGBT 5, the resistor 6 as a sense resistor, and the low voltage integrated circuit 4 as a first control circuit.

The main current flows through the MOSFET 1. The Si IGBT 5 is connected in parallel to the MOSFET 1. Furthermore, a current diverted from the main current flows through the Si IGBT 5.

The resistor 6 is connected in series with the Si IGBT 5. The low voltage integrated circuit 4 controls a gate voltage of the MOSFET 1 based on a value of a voltage to be applied to the resistor 6.

Furthermore, a ratio of the diverted current flowing through the Si IGBT 5 to the main current flowing through the MOSFET 1 in current value ranges from 0.018% to 0.022%.

In such a structure, an IGBT is used as the sense element. Since the saturation current of the IGBT is higher than that of the MOSFET, a sense area required in an effective region of a power MOSFET to ensure the surge resistance can be smaller than that when the MOSFET is used as a sense element. Accordingly, it is possible to reduce the manufacturing costs. Furthermore, it is possible to miniaturize the protection circuit.

Furthermore, setting a ratio of the diverted current flowing through the Si IGBT 5 to the main current flowing through the MOSFET 1 in current value from 0.018% to 0.022% can suppress the losses in the main current.

Furthermore, when a value of a voltage caused by the sense current is measured, a resistor with a lower resistance value can be used in such a structure. Thus, noise in the sense current can be reduced. Furthermore, upsizing of a filter for removing the noise and increase in frequency of sensing an overcurrent can be prevented.

Furthermore, a sudden rise of current in the Si IGBT 5 enables an overcurrent to be sensed with high accuracy.

The structures other than those described herein can be omitted when needed. Conversely, when at least one of the other structures described in the Description is optionally added, the advantages above can be produced.

Furthermore, the low voltage integrated circuit 4a as the first control circuit further controls the gate voltage of the Si IGBT 5 separately from the gate voltage of the MOSFET 1 according to Embodiments above.

In such a structure, when a high-level gate voltage is applied only to the path B and a low-level gate voltage is applied to the path A, only the Si IGBT 5 enters the ON state. Accordingly, increase in ON voltage across the MOSFET 1 can be reduced.

Furthermore, when a high-level gate voltage is applied only to the path A and a low-level gate voltage is applied to the path B, only the MOSFET 1 enters the ON state. Thus, the main current flows only between the drain and the source of the MOSFET 1. Thus, it is possible to reduce losses in the resistor 6 that is a resistor for sensing an overcurrent. Furthermore, since no recovery current flows through the Si IGBT 5, the erroneous interruption by the recovery current can be suppressed.

Furthermore, the low voltage integrated circuit 4a controls, at a high level, the gate voltage of the Si IGBT 5, and then the gate voltage of the MOSFET 1 according to Embodiments above. Then, the low voltage integrated circuit 4a controls, at a low level, the gate voltage of the MOSFET 1, and then the gate voltage of the Si IGBT 5.

In such a structure, when a high-level gate voltage is applied only to the path B and a low-level gate voltage is applied to the path A, only the Si IGBT 5 enters the ON state. Accordingly, increase in ON voltage across the MOSFET 1 can be reduced.

Furthermore, reducing the inductance between the source and the GND of the power MOSFET can suppress a sudden surge in di/dt.

Furthermore, the low voltage integrated circuit 4a controls, at a high level, the gate voltage of the MOSFET 1, and then the gate voltage of the Si IGBT 5 according to Embodiments above. Furthermore, the low voltage integrated circuit 4a controls, at a low level, the gate voltage of the Si IGBT 5, and then the gate voltage of the MOSFET 1.

With such a structure, when a high-level gate voltage is applied only to the path A and a low-level gate voltage is applied to the path B, only the MOSFET 1 enters the ON state. Thus, the main current flows only between the drain and the source of the MOSFET 1. Thus, it is possible to reduce losses in the resistor 6 that is a resistor for sensing an overcurrent. Furthermore, since no recovery current flows through the Si IGBT 5, the erroneous interruption by the recovery current can be suppressed.

Furthermore, the protection circuit includes the MOSFET 2 connected in series with the MOSFET 1, and the high voltage integrated circuit 3b as a second control circuit that controls the gate voltage of the MOSFET 2 according to Embodiments above.

Then, the Si IGBT 5b is incorporated into the high voltage integrated circuit 3b.

Since an overcurrent sense element (sense element) does not have to be incorporated separately in such a structure, the number of parts can be reduced.

Furthermore, the MOSFET 1 contains silicon carbide according to Embodiments above.

With such a structure, reduction in a required sense region largely contributes to reduction in the costs.

Furthermore, the protection circuit includes the electrolytic capacitor 14 as a capacitor to be is connected in parallel to the MOSFET 1 according to Embodiments above.

The structure above can reduce the losses of the overall system through reduction in the turn off losses, even in applications requiring a high-frequency operation (high-speed switching operation) as seen in a booster circuit.

Furthermore, the protection circuit system includes the MOSFETs 1a, 1b, and 1c as a plurality of first MOSFETs, the Si IGBT 5c as a single first IGBT, the resistor 6 as a first sense resistor, the low voltage integrated circuit 4c as a first control circuit, MOSFETs 2a, 2b, and 2c as second MOSFETs, and the high voltage integrated circuit 3c as a single second control circuit according to Embodiments above.

The main current flows through the MOSFETs 1a, 1b, and 1c for power. The Si IGBT 5c is connected in parallel to the MOSFETs 1a, 1b, and 1c. Furthermore, a current diverted from the main current flows through the Si IGBT 5c.

The resistor 6 is connected in series with the Si IGBT 5c. The low voltage integrated circuit 4c controls respective gate voltages of the MOSFETs 1a, 1b, and 1c based on a value of a voltage to be applied to the resistor 6.

The MOSFET 2a is connected in series with the MOSFET 1a. The MOSFET 2b is connected in series with the MOSFET 1b. The MOSFET 2c is connected in series with the MOSFET 1c.

The high voltage integrated circuit 3c controls respective gate voltages of the MOSFETs 2a, 2b, and 2c. The Si IGBT 5c is incorporated into the high voltage integrated circuit 3c.

Furthermore, a ratio of the diverted current flowing through the Si IGBT 5c to the main current flowing through each of the MOSFETs 1a, 1b, and 1c in current value ranges from 0.018% to 0.022%.

With such a structure, the number of parts can be reduced by sharing use of the Si IGBT 5c for controlling the total three-phase current.

Since the Si IGBT 5c is housed in the high voltage integrated circuit 3c, the sense element for sensing an overcurrent does not need to be provided separately, and the number of parts can be reduced. Thus, the manufacturing costs and the circuit scale can be reduced.

The structures other than those described herein can be omitted when needed. Conversely, when at least one of the other structures described in the Description is optionally added, the advantages above can be produced.

Furthermore, the protection circuit system according to Embodiments above includes the MOSFET 1 as a third MOSFET for power, the Si IGBT 5 as a second IGBT, the resistor 6 as a second sense resistor, the low voltage integrated circuit 4 as a third control circuit, and the electrolytic capacitor 14 as a capacitor.

The MOSFET 1 is connected in parallel to the MOSFETs 1a, 1b, and 1c as the plurality of first MOSFETs, and to the MOSFETs 2a, 2b, and 2c as the second MOSFETs corresponding to the MOSFETs 1a, 1b, and 1c, respectively.

The Si IGBT 5 is connected in parallel to the MOSFET 1. The resistor 6 is connected in series with the Si IGBT 5. The low voltage integrated circuit 4 controls a gate voltage of the MOSFET 1 based on a value of a voltage to be applied to the resistor 6. The electrolytic capacitor 14 is connected in parallel to the MOSFET 1.

Furthermore, a ratio of the diverted current flowing through the Si IGBT 5 to the main current flowing through the MOSFET 1 in current value ranges from 0.018% to 0.022%.

In such a structure, an IGBT is used as the sense element. Since the saturation current of the IGBT is higher than that of the MOSFET, a sense area required in an effective region of a power MOSFET to ensure the surge resistance can be smaller than that when the MOSFET is used as a sense element. Thus, it is possible to reduce the manufacturing costs and miniaturize the modules.

Furthermore, the number of parts can be reduced by sharing use of the Si IGBT 5c for controlling the total three-phase current. Particularly, the turn off power losses can be reduced in applications requiring, as seen in a booster circuit, a high-frequency operation, that is, a high-speed switching operation. Thus, the losses of the overall system can be reduced. Furthermore, the circuit scale can be reduced, and radiating fins, etc. can be downsized.

[Modifications]

Although Embodiments above assume the MOSFET mainly containing Si, Embodiments may be applied to MOSFETs containing SiC. If Embodiments are applied to the MOSFETs containing SiC, reduction in a required sense region largely contributes to reduction in the costs.

Furthermore, suppression in reducing the gate resistance using a resistor for sensing an overcurrent can suppress increase in ON resistance.

Although Embodiments described above may specify, for example, properties of materials, the materials, dimensions, a shape, a relative arrangement relationship, and conditions for implementation of each of the constituent elements, these are in all aspects illustrative and are not limited to the ones in the Description. Therefore, numerous modifications that have yet been exemplified will be devised within the scope of the present technique. Examples of the modifications include modifying, adding, or omitting at least one constituent element, and further separating at least one constituent element in at least one of Embodiments and combining the separated constituent element with a constituent element in the other Embodiment.

Furthermore, the constituent element described as one element in Embodiments above may be more than one unless it is contradictory. Furthermore, the respective constituent elements are conceptual units, and include one constituent element comprising structures, one constituent element corresponding to a part of a structure, and constituent elements included in one structure. Furthermore, each of the constituent elements includes another structure or a structure having a shape as long as it fulfils the same function.

Furthermore, the Description is referred to for all the objects of the present technique, and is not regarded as prior art.

When Embodiments specify, for example, the name of a material without any particular designation of an additive, the material includes some additive, for example, an alloy unless it is contradictory.

EXPLANATION OF REFERENCE SIGNS 10 motor, 11 coil, 12, 13, 15 diode, 14 electrolytic capacitor, 1, 1a, 1b, 1c, 2, 2a, 2b, 2c MOSFET, 3, 3b, 3c high voltage integrated circuit, 4, 4a, 4b, 4c low voltage integrated circuit, 5, 5b, 5c Si IGBT, 6, 7, 16 resistor, 8 capacitor, 17 DC power supply, 18 AC power supply, A, A1, A2, A3, B path.

The invention claimed is:

1. A protection circuit, comprising:
   a first MOSFET for power through which a main current flows;
   an IGBT which is connected in parallel to said first MOSFET and through which a current diverted from said main current flows;
   a sense resistor connected in series with said IGBT; and
   a first control circuit that controls a gate voltage of said first MOSFET based on a value of a voltage to be applied to said sense resistor,
   wherein a ratio of said diverted current flowing through said IGBT to said main current flowing through said first MOSFET in current value ranges from 0.018% to 0.022%.

2. The protection circuit according to claim 1,
   wherein said first control circuit controls a gate voltage of said IGBT separately from said gate voltage of said first MOSFET.

3. The protection circuit according to claim 2,
   wherein said first control circuit controls:
   at a high level, said gate voltage of said IGBT, and then said gate voltage of said first MOSFET; and
   at a low level, said gate voltage of said first MOSFET, and then said gate voltage of said IGBT.

4. The protection circuit according to claim 2,
   wherein said first control circuit controls:
   at a high level, said gate voltage of said first MOSFET, and then said gate voltage of said IGBT; and
   at a low level, said gate voltage of said IGBT, and then said gate voltage of said first MOSFET.

5. The protection circuit according to claim 1, further comprising:
   a second MOSFET connected in series with said first MOSFET; and
   a second control circuit that controls a gate voltage of said second MOSFET,
   wherein said IGBT is incorporated into said second control circuit.

6. The protection circuit according to claim 1,
   wherein said first MOSFET contains silicon carbide.

7. The protection circuit according to claim 1, further comprising
   a capacitor connected in parallel to said first MOSFET.

8. A protection circuit system, comprising:
   a plurality of first MOSFETs for power through which a main current flows;
   a single first IGBT which is connected in parallel to said first MOSFETs and through which a current diverted from said main current flows;
   a first sense resistor connected in series with said first IGBT;
   a first control circuit that controls a gate voltage of each of said first MOSFETs based on a value of a voltage to be applied to said first sense resistor;
   second MOSFETs connected in series with said respective first MOSFETs; and
   a single second control circuit that controls a gate voltage of each of said second MOSFETs,
   wherein said first IGBT is incorporated into said second control circuit, and
   a ratio of said diverted current flowing through said first IGBT to said main current flowing through each of said first MOSFETs in current value ranges from 0.018% to 0.022%.

9. The protection circuit system according to claim 8, further comprising:
   a third MOSFET for power that is connected in parallel to said first MOSFETs and said second MOSFETs corresponding to said first MOSFETs;
   a second IGBT connected in parallel to said third MOSFET;
   a second sense resistor connected in series with said second IGBT;
   a third control circuit that controls a gate voltage of said third MOSFET based on a value of a voltage to be applied to said second sense resistor; and
   a capacitor connected in parallel to said third MOSFET,
   wherein a ratio of said diverted current flowing through said second IGBT to said main current flowing through said third MOSFET in current value ranges from 0.018% to 0.022%.

* * * * *